United States Patent [19]

Panaro

[11] Patent Number: 4,661,807
[45] Date of Patent: Apr. 28, 1987

[54] ELECTRIC FUSE HOLDER HAVING AN INTEGRAL CURRENT SENSOR

[75] Inventor: Robert J. Panaro, Byfield, Mass.

[73] Assignee: Gould Inc., Rolling Meadows, Ill.

[21] Appl. No.: 659,974

[22] Filed: Oct. 12, 1984

[51] Int. Cl.⁴ .................................................. G08B 21/00
[52] U.S. Cl. .................................... 340/638; 340/639; 337/206; 337/241
[58] Field of Search ........................ 340/638, 639, 664; 337/206, 241, 242, 265; 324/117 R, 117 H, 127; 361/104

[56] References Cited

U.S. PATENT DOCUMENTS

| 2,036,223 | 4/1936 | Läpple | 340/639 |
| 3,056,922 | 10/1962 | Du Vall et al. | 324/127 |
| 3,138,742 | 6/1964 | Schweitzer | 324/127 |
| 3,158,713 | 11/1964 | Margulies | 337/250 |
| 3,174,011 | 3/1965 | Borys | 337/206 |
| 3,225,163 | 12/1965 | Linton | 337/196 |
| 3,457,535 | 7/1969 | Poehlman | 337/242 |
| 3,546,692 | 12/1970 | Salzer | 340/639 X |
| 3,794,948 | 2/1974 | Linton et al. | 337/242 |
| 4,286,213 | 8/1981 | Fowler | 324/127 |
| 4,506,214 | 3/1985 | Lienhard et al. | 324/127 X |
| 4,525,669 | 6/1985 | Holberton et al. | 324/127 X |
| 4,558,310 | 12/1985 | McAllise | 340/664 X |

Primary Examiner—James L. Rowland
Assistant Examiner—Brian R. Tumm
Attorney, Agent, or Firm—Frederick A. Goettel, Jr.

[57] ABSTRACT

A holder for an electric fuse is provided with apparatus which senses the flow of electric current along the current path of the fuse holder, and, which responsive to such sensing, electromagnetically induces an ascertainable signal. The signal may be detected and processed to provide an indication of whether current is flowing through the fuse holder.

23 Claims, 12 Drawing Figures

ELECTRIC FUSE HOLDER HAVING AN INTEGRAL CURRENT SENSOR

BACKGROUND OF THE INVENTION

1. Field of the Invention

The present invention relates in general to fuse holders and more particularly to a fuse holder having a sensor which provides a signal responsive to the magnetic field present when current is passing along the current path of the fuse holder.

2. Description of the Prior Art

As is well known, fuses for electric circuits are of numerous types and employ a fusible element which is enclosed in a suitable housing such as, for example, a cylinder of insulating material for preventing the component parts of the protectors from damage or deterioration. Additionally, the fuse housings are constructed of various sizes and shapes to be readily received in or removed from receptacles provided in the circuits with which the fuses are to be used.

When a large number of electrical circuits are provided in an installation, such as those in a large factory or on shipboard, it is extremely difficult for maintenance personnel to make the necessary tests of a number of fuses for the electric circuits before the particular protector that has acted to open a circuit may be located. Such testing is an extremely time consuming operation and is more or less a hit-or-miss proposition.

Various attempts have been made in the past to develop fuses for electric circuits which have indicators associated therewith in order to eliminate the necessity of manual inspection of the fuses. Some of these have been arranged to give an audible indication that a circuit has opened while others have provided for a visual indication of such a condition. One prior and commonly used indicating arrangement for visually showing that a fuse has blown and that a circuit is open has been to arrange a lamp and series resistor in the circuit, across the fuse, in such a manner that when the fused circuit was operating properly, the lamp and resistor would be shorted out but in the event that the circuit was overloaded to the extent that the fuse interrupted the circuit, a voltage would appear across the lamp to visually indicate this condition. Such a resistor/lamp arrangement has proved disadvantageous, for example, when the fuse blows, current will flow through the lamp and continue to flow through small load devices which the circuit is protecting, which may cause further breakdown in the circuit or device. Another known prior arrangement is shown in U.S. Pat. No. 3,158,713 titled Apparatus for Indicating an Open Electrical Circuit wherein a solenoid is wired in parallel with the electrical fuse which is actuated upon the fuse blowing to indicate that the fuse has operated to protect the circuit.

Another approach to indicating that an electric fuse has opened to protect an electrical circuit has been to provide an indicator in the fuse itself. Typically, such arrangements include a spring loaded pin or the like which is released to a visually ascertainable position upon the fuse blowing to protect the circuit. Such fuses are considerably more expensive than fuses not having such indicators and such a feature is particularly cost prohibitive in smaller low voltage class fuses.

SUMMARY OF THE INVENTION

In accordance with the present invention the holder or receptacle for an electric circuit protector or fuse is provided with an integral device which senses the flow of electric current along the current path of the fuse holder and, responsive to such sensing, electromagnetically induces an ascertainable signal in the sensor. The sensor is not "hard-wired" into the circuit of the fuse holder and is not damaged when a fuse blows thereby making it operationally useful for the life of the fuse holder.

In the preferred embodiment the current sensor comprises an inductive pick-up means which is carried by the fuse holder at a location where it will be electromagnetically coupled with the magnetic field surrounding at least a portion of the current path, when electric current is passing therealong, and for generating an electrical signal responsive to the electromagnetic coupling.

BRIEF DESCRIPTION OF THE DRAWINGS

The novel features that are considered characteristic of the invention are set forth with particularity in the appended claims. The invention itself, however, both as to its organization and its method of operation, together with additional objects and advantages thereof, will best be understood from the following description of the preferred embodiments when read in connection with the accompanying drawings wherein like numbers have been employed in the different figures to denote the same parts and wherein:

DESCRIPTION OF THE PREFERRED EMBODIMENTS

Figure 1:
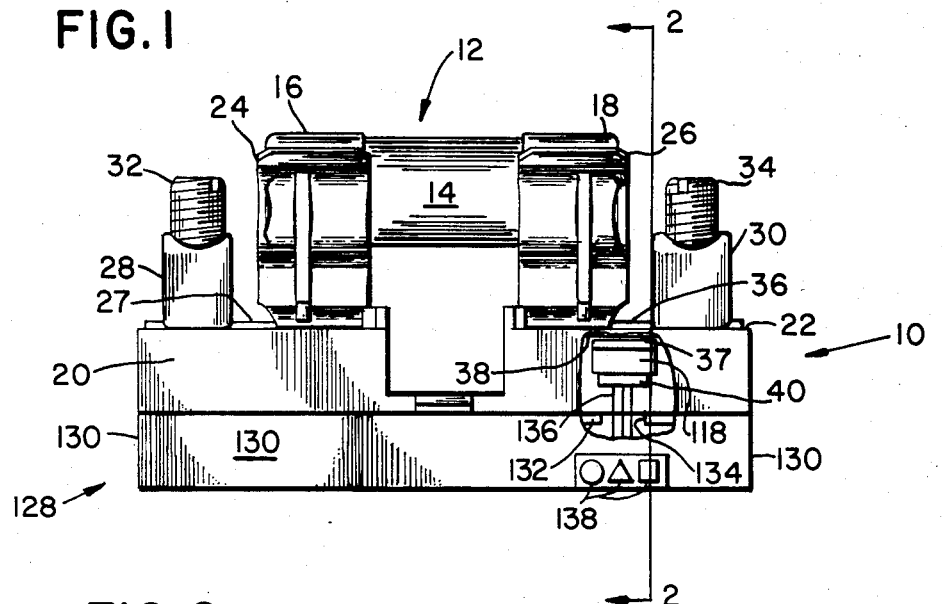
FIG. 1 is a vertical elevation, partially broken away, of a fuse holder having a Hall-effect sensor arrangement.

Looking first at FIG. 1 reference numeral 10 refers generally to a fuse holder of the type conventionally used to receive a cartridge type electrical circuit protection device or fuse 12. The fuse includes a cylindrical insulating body 14 and a pair of end caps 16, 18 defining spaced electrical terminals at the opposite ends thereof.

The fuse holder comprises a mounting base 20 formed from a suitable dielectric material such as, for example, being molded from a thermosetting phenolic compound. Attached to the upper surface 22 of the fuse base are a pair of spaced apart fuse engaging clips 24,26. The clips are suitably attached to the upper surface 22 at locations such that they may be electrically conductively engaged with the spaced apart terminals 16, 18 of a fuse adapted to be mounted in the base. Each of the fuse clip elements 24, 26 has associated therewith an electrical connector each of which is electrically conductively attached to its associated fuse clip 24, 26, respectively. The connectors 28, 30 each serve to electrically cooperate with external conductors (not shown) thereby defining the path followed by electric current through the fuse base.

In the embodiment shown in FIG. 1 each of the fuse clip/connector arrangements is of the type having a spring type fuse clip adapted to positively engage one of the cylindrical end caps of a fuse and a "box type" connector for providing the connection to the external wiring. While not shown specifically in the drawings it should be appreciated that each of the "box type" connectors is provided with a through opening extending horizontially therethrough as viewed in FIG. 1 to receive the bare end of a wire, the wire is then positively retained in the connector by engagement with the vertically extending set screws 32, 34 as shown in the drawing figure.

Looking now specifically to the clip/connector arrangement 26/30 on the right hand side of the fuse holder of FIG. 1 it will be seen that the connector 30 and the fuse clip 26 are electrically interconnected by a flat section 36 of electrically conductive material providing the current path between the connector and the fuse clip. All metallic parts in such fuse holders are typically made of very high quality electrical copper and bronzes depending on the requirements of the particular fuse holder and in many cases may be provided with a protective plating on the outer surface thereof.

The flat conductive interconnecting portion 36 defined above lies in substantially direct contact with the upper surface 22 of the fuse holder base 20. It will be seen with reference to FIGS. 1, 2, and 3 that the fuse holder base, in the region of the interconnecting strip 36, comprises a wall 37 of insulating material defining a substantially flat downwardly facing lower surface 38 which is substantially parallel to the upwardly facing surface 22 with which the interconnecting strip 36 is in confronting relation. It has been found that, when current is flowing through the fuse holder, the flow of current through the interconnecting strip 36 results in a particularly useful magnetic field therearound which may be sensed by a current sensing device positioned adjacent the downwardly facing surface 38 of the fuse base described above.

Figure 2:
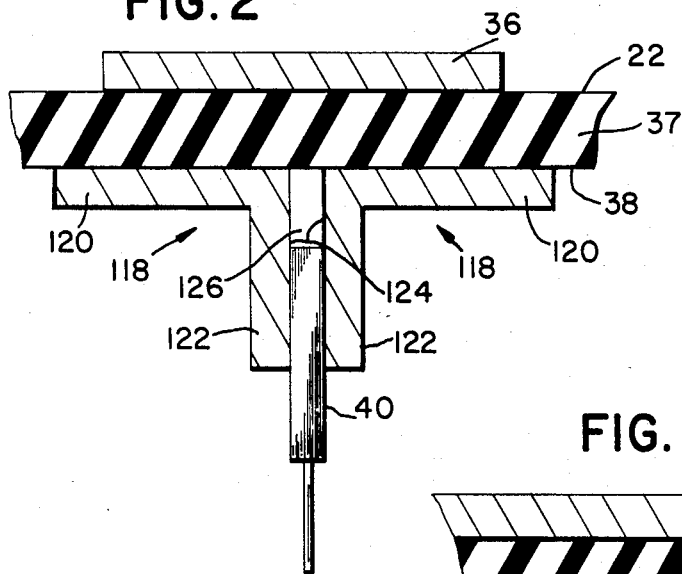
FIG. 2 is a greatly enlarged detailed sectional view taken along the line 2—2 of FIG. 1.
Figure 3:
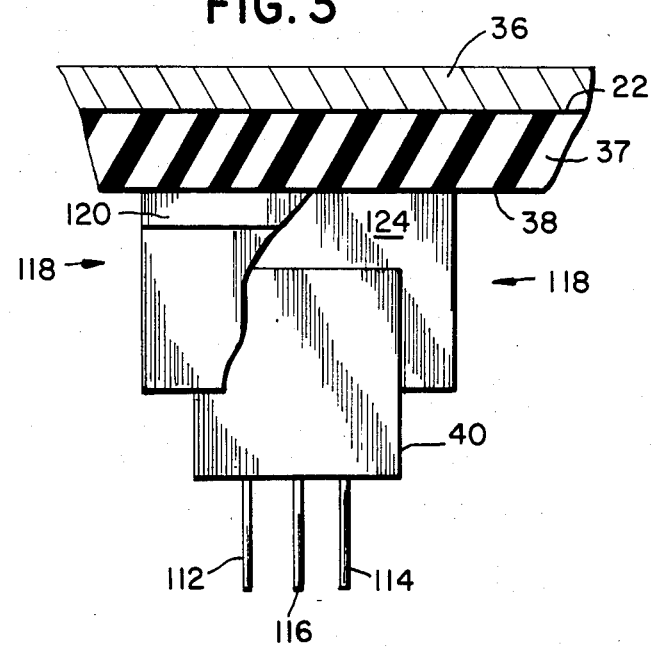
FIG. 3 is a side view of the detailed showing of FIG. 2.

In the embodiment shown in FIG. 1, 2, and 3 the current sensor 40 comprises a Hall-effect device which is capable of providing an output voltage which is directly proportional to current flow through the flat interconnecting section 36. The specifics of the arrangement of this current sensor device and the novel aspects thereof as shown in FIGS. 1, 2, and 3 will be further described in greater detail hereinbelow.

It should be appreciated that in its broadest sense the invention comprises the incorporation in a fuse holder of a current sensing device capable of detecting the flow of current through some portion of the current path of the fuse holder. With that in mind reference is made again to FIG. 1 wherein it will be appreciated that the current path through such a fuse holder begins at the right hand end of the fuse holder with the first connector 30 adapted to engage an external power source and from there it extends through the interconnecting element 36 to the first fuse clip 26. From the fuse clip 26 the current path extends through the right hand fuse cap 18, through the fusible element of the fuse contained within the fuse casing to the left hand fuse cap 16. From the left hand fuse cap 16 the current path extends through the left hand clip 24 through the left hand interconnecting strip 27 and to the left hand connector block 28 for engaging a second external conductor. According to the invention, current sensor means may be incorporated within a fuse holder anywhere along the "current path" of the fuse holder wherein sufficient magnetic flux is present, as a result of the flow of current through the fuse holder, to permit sensing of the magnetic field. One particularly advantageous way of sensing the presence of such magnetic field is a sensor of the type which may be broadly categorized as an "inductive type pick-up arrangement". In its broadest sense such an inductive pick-up arrangement may comprise, by way of examples: a conductive wire extending parallel to the current path through the fuse holder; a rod of ferromagnetic material positioned in the mounting base in close proximity to the current path; or, a coil of wire such as for example a coil of enameled copper wire. Any of the above described simple inductive pick-up means is capable of having a current induced therein as a result of interaction with the magnetic field which is present along the current path through the fuse holder. Such induced current results in a useful signal which may then be processed to derive information relating to the current flow through the fuse holder.

More specifically the signal or output voltage from the current sensing device may be detected and processed by a variety of electrical/electronic means to provide an indication of whether current is flowing through a fuse holder and the magnitude of such current flow.

In one simple embodiment the output voltage from a fuse holder mounted current sensor has been used to power a visually ascertainable indicator mounted directly on the fuse holder base, such as an L.E.D. or an L.C.D.

It should be appreciated that while the invention, for matter of convenience, is described in connection with a fuse holder of the type adapted to carry a cartridge type fuse the invention may be applied to any fuse holder type. More specifically, it should be appreciated that, any fuse holder has a "current path" therethrough and the present invention is intended to include the incorporation of a current sensor in other types of fuse holders along such current path at a location wherein sufficient magnetic flux is present to enable interaction of a current sensor with the magnetic field surrounding a portion of the current path when current is passing through the fuse holder/fuse combination.

Figure 4:
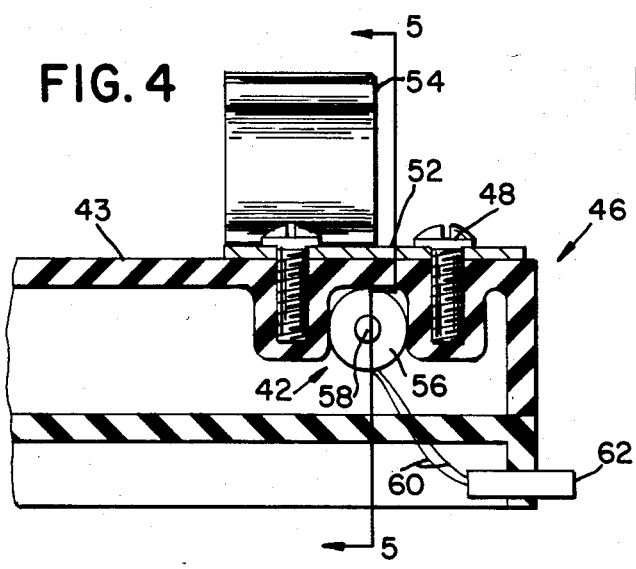
FIG. 4 is a longitudinal sectional view of one end of a fuse holder showing one form of current sensor arrangement.
Figure 5:
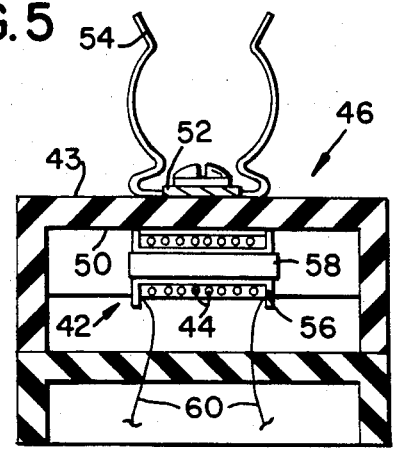
FIG. 5 is a sectional view taken along the line 5—5 of FIG. 4.

Looking now to FIGS. 4 and 5 a current sensor 42 making use of the inductive pick-up principle is illustrated wherein a coil 44 is positioned in the region underlying the fuse base upper surface 43 where it will be electromagnetically coupled with the magnetic field of the fuse base. In this embodiment the fuse holder base 46 is shown in a somewhat simplifed form from that of FIG. 1. The connector arrangement 48 for electrically cooperating with an external conductor is also shown in a simplified form. As with the embodiment of FIG. 1 the current sensor 42 is positioned adjacent the downwardly facing surface 50 of the top wall of the fuse holder mounting base in a position in close proximity to a flat conductive strip 52 interconnecting the connector 48 and one of the fuse clips 54. In the embodiment in FIGS. 4 and 5 the current sensor 42 comprises a bobbin 56 having a longitudinally extending opening therethrough through which an iron core 58 is suitably positioned and retained. The bobbin 56 is wound with a coil 44 thereupon defined by a plurality of circumfrential windings of a suitable enameled copper wire or the like. The number of windings defining the coil is dependent on the amperage rating of the fuse holder in which the coil is incorporated, a larger number of windings being necessary on lower amperage rating fuse holders in order to obtain the necessary output across the coil. As shown in FIG. 4 and 5 the ends 60 of the coil are electrically connected with a suitable output connector 62 so that the signal induced across the output of the coil as a result of the electromagnetic coupling with the current through the fuse base may be readily accessed by whatever signal processing equipment the end user deems appropriate for his application.

Figure 6:
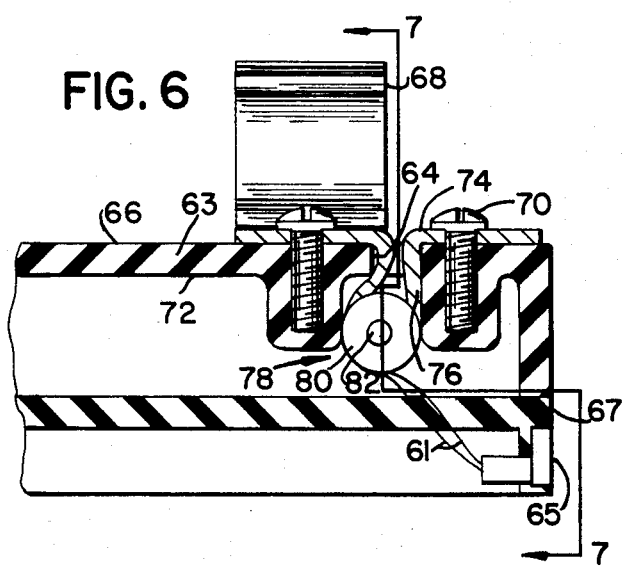
FIG. 6 is a view similar to FIG. 4 showing another form of sensor arrangement.
Figure 7:
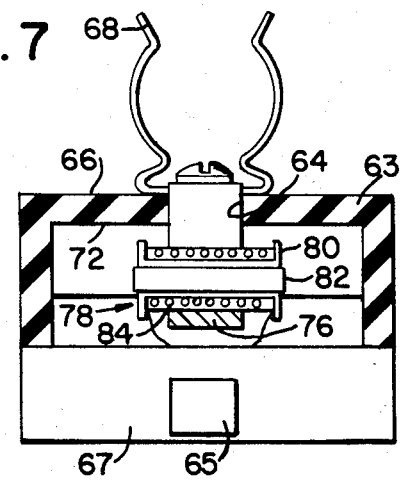
FIG. 7 is a sectional view taken along the line 7—7 of FIG. 6.

Looking now at FIGS. 6 and 7 a modification of the current sensor arrangement of FIGS. 4 and 5 is shown. In this embodiment an opening 64 is provided in the top supporting wall 63 of the fuse base. The opening 64 passes from the upward surface 66 upon which the fuse clip 68 and connector 70 are mounted, through and into communication with the region underlying and adjacent the downwardly facing surface 72 of the wall 63. The flat section of electrically conductive material 74 which interconnects the fuse clip 68 and the connector 70 passses downwardly through the above described opening 64 and forms a loop 76 in the region adjacent the downwardly facing surface 72 and then passes upwardly again through the opening 64 back to a position adjacent to the upwardly facing surface 66. Passing through the loop 76 defined by the current carrying interconnecting member is a current sensing arrangement 78 comprising a bobbin 80, iron core 82, and winding 84 of the type described hereinabove with respect to FIGS. 4 and 5. The loop 76 formed by the current carrying interconnecting member 74 around the bobbin/coil/core arrangement serves to concentrate the magnetic flux passing through the interconnecting member 74 in a manner enabling the arrangement to sense smaller currents passing along the current path than possible with the embodiment of FIGS. 4 and 5.

In this embodiment the coil output leads 61 are connected directly to an indicator, comprising for example an L.C.D. or an L.E.D. 65 which is mounted directly on a side wall 67 of the base of the fuse holder. This indicator 65 provides a visually ascertainable display, carried directly by the fuse holder, responsive to the electric signal generated by the current sensor 78.

Figure 8:
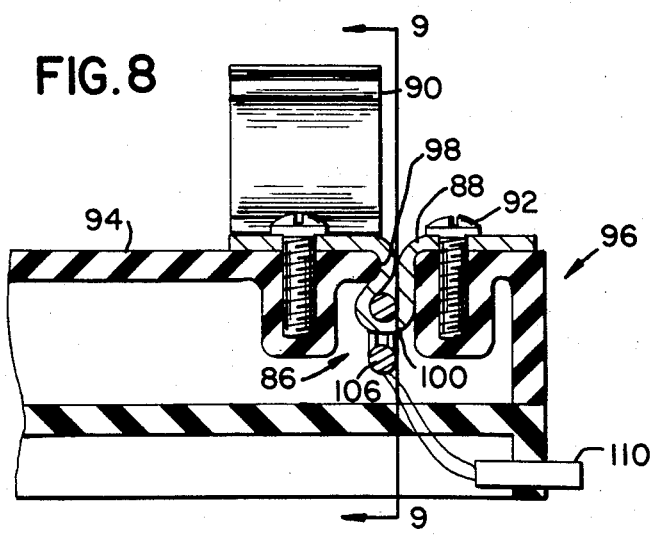
FIG. 8 is a view similar to FIG. 4 showing still another form of sensor arrangement.
Figure 9:
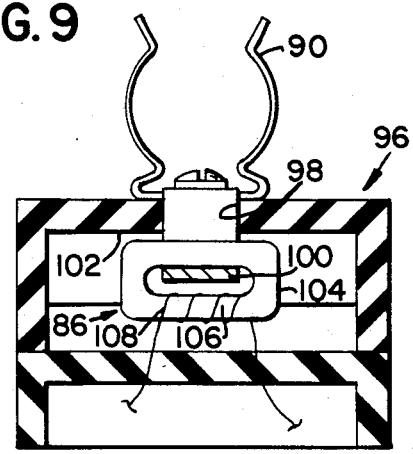
FIG. 9 is a sectional view taken along the line 9—9 of FIG. 8.

Looking now to FIGS. 8 and 9 another inductive type current sensor arrangement 86 is shown. As in the embodiment of FIGS. 6 & 7, the current carrying member 88, which interconnects the fuse clip 90 and the external connector 92, passes from the upper surface 94 of the fuse base 96 through an opening 98 therein to form a loop 100 adjacent the downwardly facing lower surface 102 of the support wall of the fuse holder. This embodiment is essentially a current transformer, in that a core 104 formed from a suitable ferromagnetic material such as iron passes through and encircles the loop 100 formed by the interconnecting member 88. A portion 106 of the iron core 104, not lying within the loop, is provided with a suitable winding 108 of conductive wire which forms the secondary winding of the current transformer. The loop 100 formed by the interconnecting member 88 serves as the primary winding of the current transformer. As in the embodiment of FIGS. 4 and 5 the ends of the secondary winding 108 across which a useful signal is generated may be attached to a suitable output connector 110 to provide access by the end user. Alternatively a direct indicating arrangement as shown in FIGS. 6 and 7 may be used.

Returning now to FIGS. 1 through 3, in the embodiment shown, the Hall-effect sensor 40 is actually a magnetically responsive device which utilizes the Hall-effect for sensing a magnetic field. Specifically, a Hall cell included in the device senses a magnetic field and provides an electrical output corresponding to the presence or absence of a magnetic field. Such a Hall-effect device is the Sprague UGN-3503U, which in addition to the Hall cell, includes an amplifier, trigger, and output stages integrated into a single monolithic chip.

One of the advantages of this Hall-effect device is that it has an extremely small outer package dimension which facilitates positioning of the device in a variety of fuse holder configurations, particularly, smaller fuse holders having limited space available for mounting of a current sensing device.

The Hall-effect device itself 40 is square and substantially flat and has three in-line pins providing input and output connections. One of the outer pins 112 is connected to a regulated DC power supply to provide a collector voltage to the output transistor of the Hall-effect device. The other of the outside pins 114 is the output pin at which the "Hall-voltage" is present when current is flowing through the fuse holder. The center pin 116 is a common ground for both the input voltage and the output or Hall voltage.

The Hall-effect device 40 is supported in the desired position underlying the downwardly facing surface 38 of the wall 37 of the fuse holder base in close proximity to the current carrying, interconnecting strip 36 by a pair of L-shapped brackets 118. One leg 120 of each of the L-shapped brackets 118 is fixedly attached to the downwardly facing surface 38 of the wall 37 by suitable means such as for example a cyanoacrylate adhesive. The L-shaped brackets 118 are positioned so that the other legs 122 of the brackets extend downwardly from the surface 38 with the opposing faces 124 of the legs defining an air gap 126 therebetween. The air gap 126 is substantially the same thickness as the narrow dimensions of the Hall-effect device 40 and the device is adhesively attached to the faces 124 to retain it in the desired location within the air-gap.

It should be appreciated that the position of the Hall-effect device 40 with respect to the interconnecting strip 36 may be easily controlled by selective positioning of the Hall-effect device 40 in the air gap 126 defined by the L-shaped brackets.

The L-shaped brackets 118 are each fabricated from a ferromagnetic material which is capable of concentrating the magnetic field which surrounds the interconnecting strip 36, when current is flowing through the strip, into the air gap 126 and therefore in the region of the Hall-effect sensor 40.

Looking now at FIG. 1 the fuse holder mounting base 20 is shown sitting upon a rectangular metal box 128 comprising four side walls 130 and an upper wall 132. The four side walls 130 are substantially coextensive with the outer perimeter of the fuse holder mounting base 20 and the upper wall 132 interconnecting the upper edges of the four side walls is coextensive with the downwardly facing surface of the fuse base. A small opening 134 is provided in the upper wall 132 of the metal box 128 through which the three leads 136 associated with the Hall-effect sensor means 40 pass to their appropriate input/output terminals. The terminals 138 associated with the three outputs are located in one of the side walls 130 of the metal box and are indicated symbolically by a circle, triangle, and square in FIG. 1.

The metal box 128 described hereinabove is made from a material which serves to shield the conductors 136 associated with the Hall-effect sensor 40 from the current path of the fuse holder. Accordingly, while the magnetic field surrounding a portion of the current path of the fuse holder is of the utmost importance to the sensing arrangement of the present invention it is desired to shield the inputs and outputs to the sensing means 40 from this magnetic field in order to avoid interference and crosstalk between the circuits.

Figure 10:
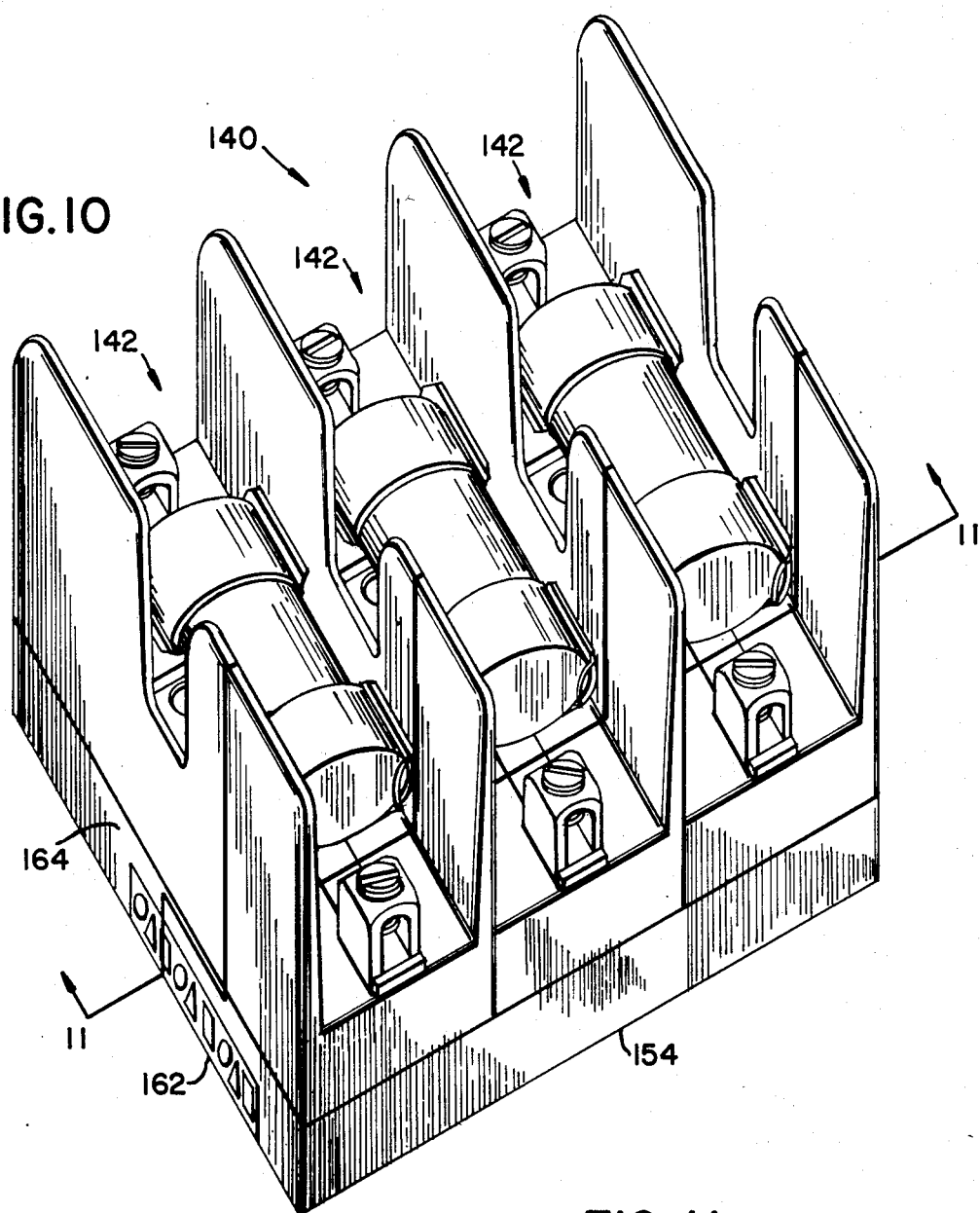
FIG. 10 is a perspective view of a three phase fuse holder provided with a current sensor arrangement for each fuse.
Figure 11:
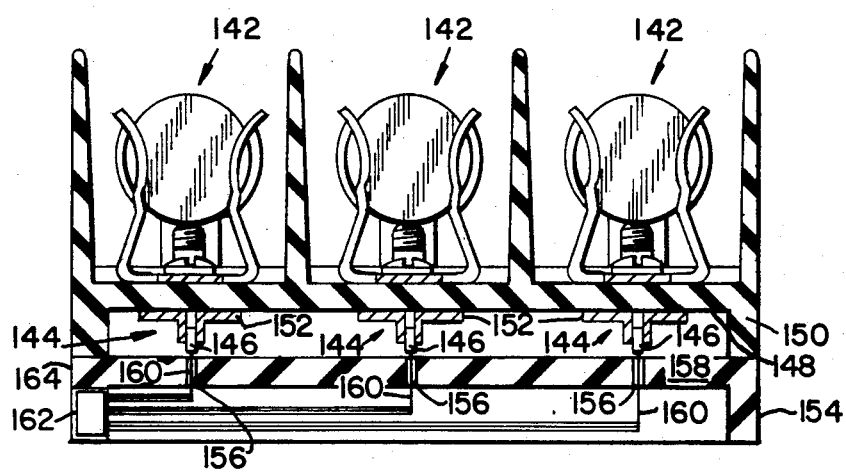
FIG. 11 is a sectional end view taken along the line 11—11 of FIG. 10.

Looking now to FIGS. 10 and 11 a three pole fuse holder 140 is shown which may be readily used to protect a three phase electrical supply system. Each of the three fuse holders 142 shown in these figures is substantially the same as that illustrated in FIG. 1. More specifically, each is supplied with its own current sensor arrangement 144 comprising a Hall-effect sensor 146 mounted to the downwardly facing surface 148 of the fuse holder base 150 by a magnetic field concentrating arrangement 152 as described in detail hereinabove. The three pole fuse holder 140 is mounted upon a rectangular shielding box 154 provided with three openings 156 in the top wall 158 thereof to permit passage into the box of the input/output leads 160 associated with the three separate Hall-effect current sensing arrangements 144. After passing through their respective openings 156 into the shielded box 154 all of the input/output leads 160 pass to a suitable access panel 162 on one side 164 of the shield box 154. At the access panel 162 the inputs and outputs are identified as to which of the three fuse holders 142 they are associated with by an appropriate numbering or color-coded scheme. As shown in FIG. 10 a symbol system, as described above, may be used to identify the pin connection with which the connectors are associated.

Figure 12:
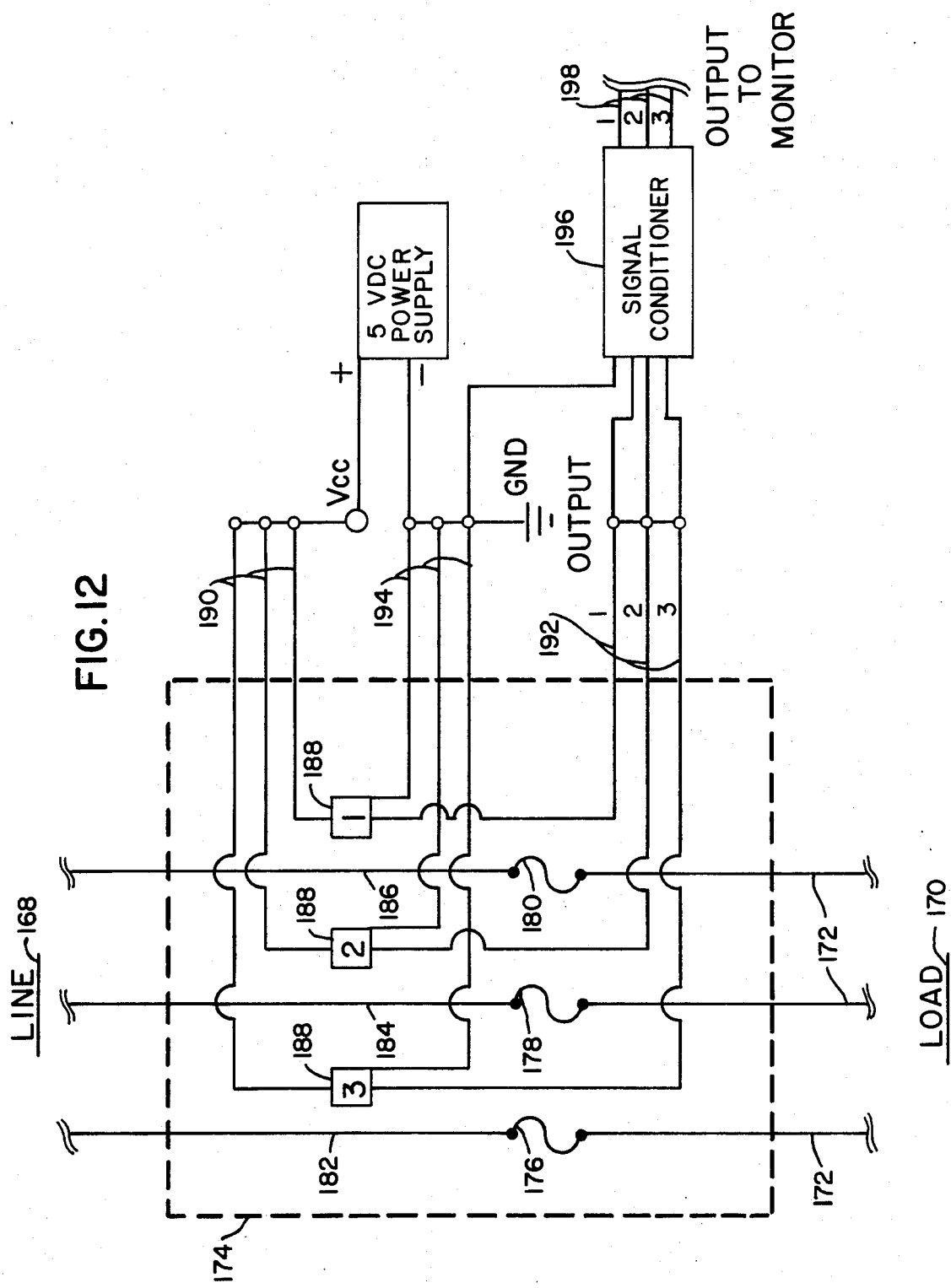
FIG. 12 is a circuit diagram of a fuse holder mounted current sensor arrangement for a three phase fuse holder.

FIG. 12 is a circuit diagram of the invention as applied to a three phase fuse holder such as that shown in FIGS. 10 and 11. A three phase power source, "Line" 168, is applied to a three phase load 170 by three bus bars 172. A three phase fuse holder of the type shown in FIG. 10 and 11 which is represented generally by the dashed outline 174 is interposed between the power source 168 and load 170. The fuses, protecting the three phases are identified by the reference numerals 176, 178, and 180, and the portion of the current path of the three fuse holders to be sensed by the current sensors are identified respectively by the reference numerals 182, 184, and 186. Current sensors, each identified by the reference numeral 188, comprising Hall-effect devices, are positioned adjacent each of the portions of the fuse holder current paths to be monitored. As discussed hereinabove each of the Hall-effect sensors has three leads associated with it. A first lead 190 providing an input voltage from a 5 volt regulated DC power supply, a second 192 providing the output for the Hall voltage, and a third lead 194 comprising a common ground for both input and output circuits.

The output 192 from the three current sensing arrangements 188 is shown passing into a box 196 identified in the drawing as a signal conditioner wherein suitable well known electronic signal conditioning means may be employed to amplify and process the output signals and to generate appropriate outputs 198 for monitoring the condition of the three circuits. The monitor may comprise a visual display such as an L.E.D. or the like or, more sophisticated electronic circuitry may be used to derive further information from the output.

This invention may be practiced or embodied in still other ways not departing from the spirit or essential charactor thereof. The preferred embodiments described herein are therefore illustrative and not restrictive, the scope of the ivention being indicated by the appended claims and all variations which come within the meaning of the claims are intended to be embraced therein.

What is claimed is:

1. A holder for an electric fuse, the fuse having a pair of spaced electrical terminals, the holder comprising:
   a mounting base formed from a dielectric material;
   first means, carried by said base, for electrically conductively cooperating with one of the fuse's electrical terminals and for electrically conductively cooperating with a first external conductor;
   second means, carried by said base, for electrically conductively cooperating with the other of the fuse's electrical terminals and for electrically conductively cooperating with a second external conductor;
   said first means and said second means together defining the current path through said fuse holder when an electric fuse is in cooperating relationship therewith; and,
   current sensor means carried by said holder at a location where it will be electromagnetically coupled with the magnetic field surrounding at least a portion of said current path when electric current is passing along said current path and for generating an electrical signal responsive to said electromagnetic coupling.

2. The fuse holder of claim 1 wherein said current sensor means comprises an inductive pick-up means.

3. The fuse holder of claim 2 wherein said inductive pick-up means comprises a coil of wire.

4. The fuse holder of claim 3 wherein said coil comprises a plurality of turns of enameled copper wire wound around a ferromagnetic core.

5. The fuse holder of claim 3 further including a bobbin around which said coil is wound, said bobbin having an opening extending along the longitudinal axis thereof and further including a ferromagnetic core extending through said longitudinal opening.

6. The fuse holder of claim 5 wherein said inductive pick-up means, comprising said coil, said bobbin and said core are permanently mounted in said mounting base in close proximity to said current path.

7. The fuse holder of claim 6 wherein the longitudinal axis of said bobbin extends substantially perpendicular to the direction of said portion of said current path.

8. The fuse holder of claim 2 wherein said mounting base comprises an upper surface and a lower surface, said first means and said second means which define the current path through said fuse holder being mounted on said upper surface of said mounting base and wherein said inductive pick-up means is affixed to said mounting base adjacent to said lower surface thereof at a location closely adjacent to said current path.

9. The fuse holder of claim 1 further including means, mounted on said fuse holder for generating a visually ascertainable display responsive to said electrical signal.

10. A holder for an electric fuse, the fuse having a pair of spaced electrical terminals, the holder comprising:
   a mounting base formed from a dielectric material;
   a fuse clip mounted on said base for electrically conductively cooperating with one of the fuse's electrical terminals;
   a connector means mounted on said base for electrically conductively cooperating with a first external conductor;
   means for electrically interconnecting said fuse clip and said connector means;
   means, carried by said base, for electrically conductively cooperating with the other of the fuse's terminals and for electrically conductively cooperating with a second external conductor; and,
   current sensor means comprising an inductive pickup means, carried by said mounting base in close proximity to said means for electrically interconnecting said fuse clip and said connector means for, generating an electric signal responsive to the flow of current through said means for interconnecting.

11. The fuse holder of claim 10 wherein said mounting base comprises an upper surface and a lower surface, said fuse clip, said connector means, said means for electrically interconnecting, and said means for electrically conductively cooperating are all mounted on said upper surface of said mounting base, and, wherein said inductive pick-up means is positioned adjacent to said lower surface of said mounting base at a location in close proximity to said means for electrically interconnecting said fuse clip and said connector means.

12. The fuse holder of claim 11 wherein said mounting base has an opening therein adjacent said means for electrically interconnecting, said opening communicating said upper and lower surfaces, said means for electrically connecting passing through said opening and forming a loop underlying said lower surface, and wherein said inductive pick-up means comprises a coil of wire positioned within said loop.

13. The fuse holder of claim 12 further including a bobbin around which said coil is wound, said bobbin having a through opening extending along the longitudinal axis thereof, and, further including a ferromagnetic core extending through said opening in said bobbin.

14. The fuse holder of claim 13 wherein the longitudinal axis of said bobbin extends through said loop in a direction substantially perpendicular to the direction of current flow through said loop.

15. The fuse holder of claim 11 wherein said mounting base has an opening therein adjacent said means for electrically interconnecting, said opening communicating said upper and lower surfaces, said means for electrically connecting passing through said opening and forming a loop underlying said lower surface, and wherein said inductive pick-up means comprises a current transformer comprising a ferromagnetic core having a portion thereof passing through said loop, said loop defining the primary winding of said current transformer, and a secondary winding around a portion of said core outside of said loop.

16. The fuse holder of claim 10 further including means, mounted on said fuse holder for generating a visually ascertainable display responsive to said electrical signal.

17. The fuse holder of claim 10 wherein said means for interconnecting comprises a substantially flat section of conductive material having an axis defined as being parallel to the direction of current flow through said means for interconnecting.

18. The fuse holder of claim 17 wherein said inductive pick-up means comprises an elongated rod of ferromagnetic material affixed to said mounting base in close proximity to said axis of said means for interconnecting.

19. The fuse holder of claim 17 wherein said inductive pick-up means comprises a coil of wire.

20. The fuse holder of claim 19 wherein said coil comprises a plurality of turns of enameled copper wire wound around a ferromagnetic core.

21. The fuse holder of claim 19 further including a bobbin around which said coil is wound, said bobbin having a through opening extending along the longitudinal axis thereof and further including a ferromagnetic core extending through said opening.

22. The fuse holder of claim 21 wherein said inductive pick-up means, comprising said coil, said bobbin, and said core are permanently mounted in said mounting base in close proximity to said axis of said means for interconnecting.

23. The fuse holder of claim 22 wherein the longitudinal axis of said bobbin extends substantially perpendicular to said axis of said means for interconnecting.

* * * * *